United States Patent [19]

Wu

[11] Patent Number: 5,766,995
[45] Date of Patent: Jun. 16, 1998

[54] METHOD FOR FORMING A DRAM CELL WITH A RAGGED POLYSILICON CROWN-SHAPED CAPACITOR

[75] Inventor: Shye-Lin Wu, Hsinchu, Taiwan

[73] Assignee: Texas Instruments - Acer Incorporated, Hsinchu, Taiwan

[21] Appl. No.: 962,623

[22] Filed: Nov. 3, 1997

[51] Int. Cl.$^6$ .................. H01L 21/8242; H01L 21/20
[52] U.S. Cl. .................. 438/255; 438/254; 438/398
[58] Field of Search .................. 438/238–240, 438/253–255, 381, 396–398; 257/306–307, 309–310

[56] References Cited

U.S. PATENT DOCUMENTS

| | | | |
|---|---|---|---|
| 5,137,842 | 8/1992 | Chan et al. | 438/254 |
| 5,164,337 | 11/1992 | Ogawa et al. | 438/254 |
| 5,266,514 | 11/1993 | Tuan et al. | 437/52 |

OTHER PUBLICATIONS

Watanabe, H. et al, "A New Cylindrical Capacitor Using Hemispherical Grained Si(HSG-Si) for 256Mb DRAMs", IEDM, 1992, pp. 259–262.

Sakao, M. et al, "A Capacitor–Over–Bit–Line (COB) Cell with a Hemispherical–Grain Storage Node for 64Mb DRAMs", IEDM, 1990, pp. 655–658.

Watanabe, H. et al, "A Novel Stacked Capacitor with Porous–Si Electrodes for High Density DRAMs", pp. 17–18, NEC Corp. Japan, Publisher and Publishing date are unknown.

Primary Examiner—Joni Chang
Attorney, Agent, or Firm—Merchant, Gould, Smith, Edell, Welter & Schmidt

[57] ABSTRACT

A method for forming a ragged polysilicon crown-shaped capacitor of a dynamic random access memory cell is disclosed. The method includes forming a first dielectric layer (122) on a semiconductor substrate, and then forming a first silicon nitride layer (124) on the first dielectric layer. Next, a portion of the first silicon nitride layer is removed to form a first hole therein. A first polysilicon spacer (126) is then formed on sidewall of the first silicon nitride layer. Portions of the first dielectric layer are etched, therefore exposing a surface of the substrate, and forming a second hole in the first dielectric layer. Subsequently, a second doped polysilicon layer (128) is formed, thereby refilling the second hole. A second silicon nitride layer (130) is then formed, and the second silicon nitride layer and the second doped polysilicon layer are patterned to form a storage node. After patterning to form a third doped polysilicon spacer (132) on sidewalls of the second silicon nitride layer and the second doped polysilicon layer, the second silicon nitride layer and the first silicon nitride layer are etched by phosphoric acid solution ($H_3PO_4$), and therefore surfaces of the third doped polysilicon spacer and the second doped polysilicon layer are roughened. Finally, a second dielectric layer (136) is formed, and a conductive layer (138) is formed on the second dielectric layer.

20 Claims, 6 Drawing Sheets

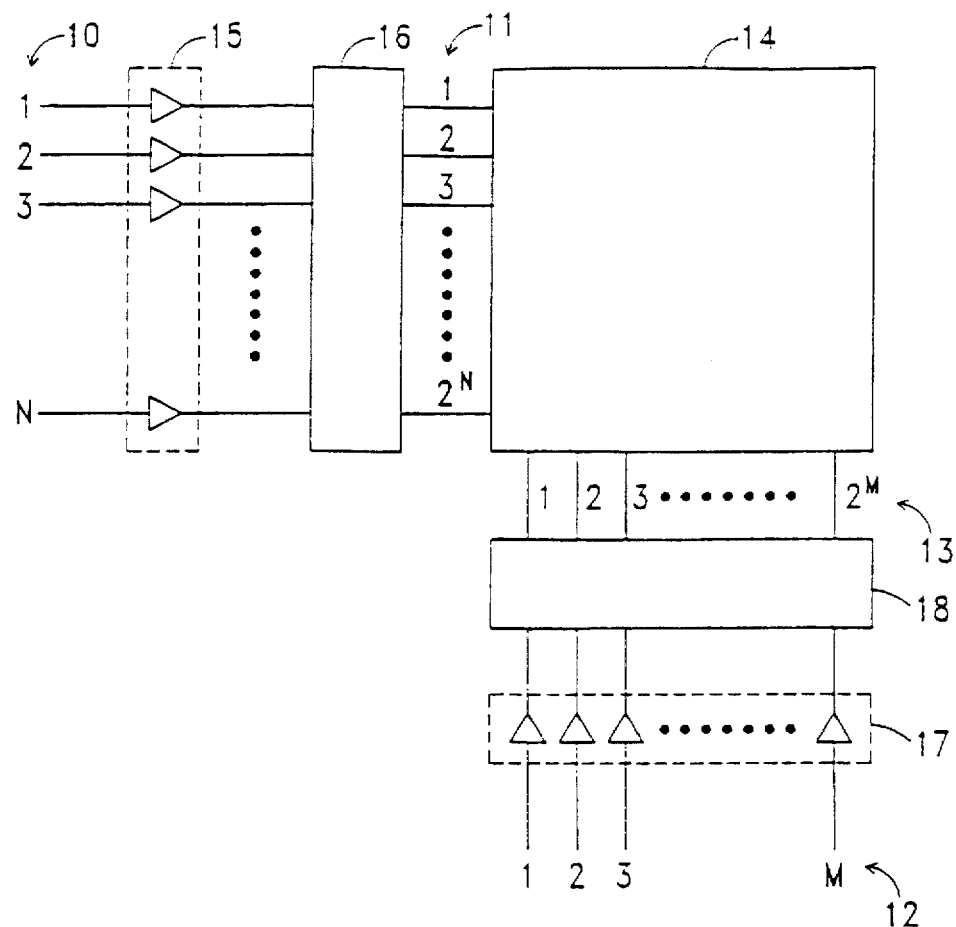
FIG. 1
(Prior Art)
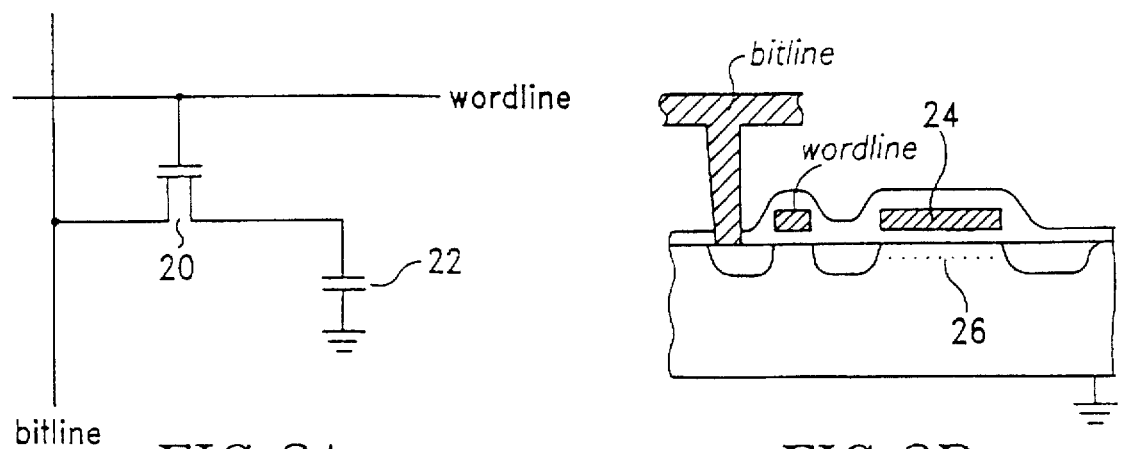
FIG. 2A
(Prior Art)
FIG. 2B
(Prior Art)

METHOD FOR FORMING A DRAM CELL WITH A RAGGED POLYSILICON CROWN-SHAPED CAPACITOR

BACKGROUND OF THE INVENTION

1. Field of the Invention

The present invention relates to dynamic random access memory (DRAM) fabrication, and more particularly, to a method for forming a ragged polysilicon crown-shaped capacitor of a dynamic random access memory cell.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a ragged polysilicon crown-shaped capacitor of a dynamic random access memory cell that substantially increases the surface of the capacitor. In one embodiment, a first dielectric layer and a silicon oxide layer are sequentially formed on a semiconductor substrate. A first silicon nitride layer is then formed on the silicon oxide layer. Next, a portion of the first silicon nitride layer is removed to form a first hole therein, therefore exposing a surface of the silicon oxide layer, wherein the hole is formed approximately over a portion of a source area in the substrate. Thereafter, a first polysilicon spacer is formed on sidewall of the first silicon nitride layer; and portions of the silicon oxide layer and the first dielectric layer are etched using the first polysilicon spacer and the first silicon nitride layer as a mask, therefore exposing a surface of the substrate, and forming a second hole in the silicon oxide layer and the first dielectric layer. Subsequently, a second doped polysilicon layer is formed on the first silicon nitride layer, the first polysilicon spacer, and the substrate to refill the second hole, and a second silicon nitride layer is formed on the second doped polysilicon layer. After patterning the second silicon nitride layer and the second doped polysilicon layer to form a storage node, a third doped polysilicon spacer is formed on sidewalls of the second silicon nitride layer and the second doped polysilicon layer. Next, the second silicon nitride layer and the first silicon nitride layer are etched by phosphoric acid solution ($H_3PO_4$) so that the surfaces of the third doped polysilicon spacer and the second doped polysilicon layer are roughened. Finally, a second dielectric layer is formed on the third doped polysilicon spacer, the second doped polysilicon layer, and the silicon oxide layer; and a conductive layer is formed on the second dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a simplified diagram illustrative of the organization of a typical large semiconductor memory;

FIG. 2A shows a circuit schematic diagram of a typical one-transistor dynamic random access memory (DRAM) cell;

FIG. 2B shows a cross-sectional view illustrative of traditional one-transistor DRAM storage cell.

DESCRIPTION OF THE PREFERRED EMBODIMENT

Figure 3:
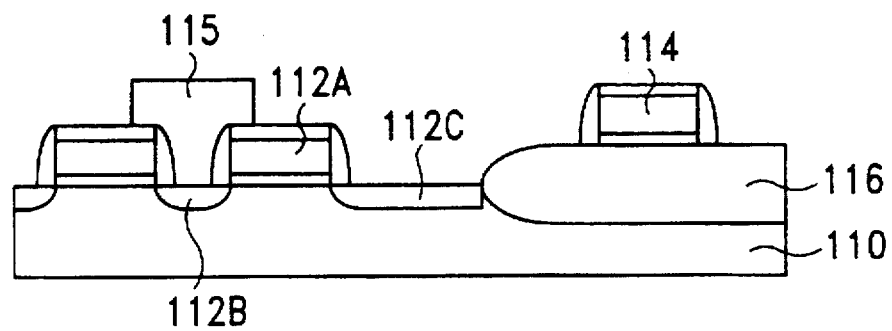
FIGS. 3–11 show cross-sectional views illustrative of various stages in the fabrication of a DRAM capacitor in accordance with the present invention.

Referring to FIG. 3, a metal-oxide-semiconductor field effect transistor (MOSFET) having a gate 112A, a drain 112B and a source 112C, is conventionally formed in and on the substrate 110. A field oxide (FOX) region 116 is conventionally formed in the substrate 110 adjacent to the MOSFET for isolation purposes. Further, a word line 114 is formed on the FOX region 116, and a bit line 115 is formed on the substrate 110. In this embodiment, the MOSFET is an n-channel MOSFET that forms part of a DRAM cell.

Figure 4:
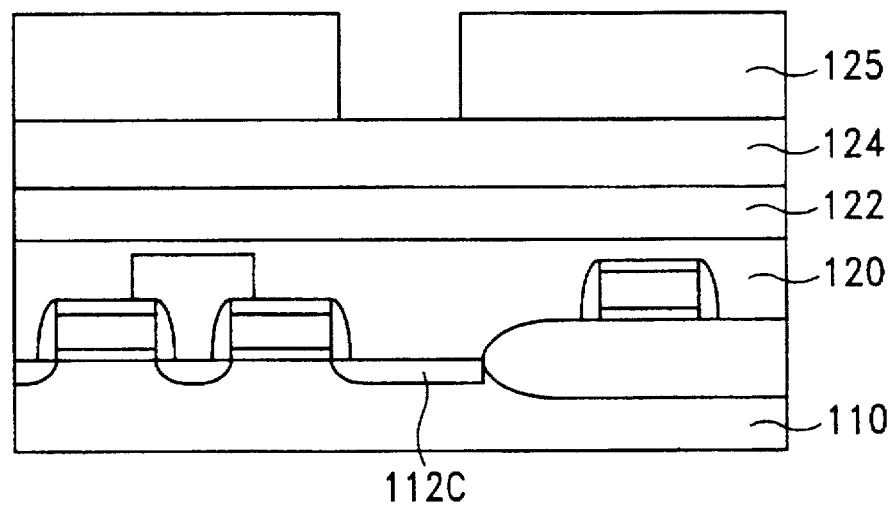

Next, another dielectric layer 120, such as a doped silicon oxide layer or boro-phosphosilicate glass (BPSG), is deposited over the substrate 110 and the structure of FIG. 3 using a conventional low pressure chemical vapor deposition (LPCVD) or plasma enhanced chemical vapor deposition (PECVD) process as shown in FIG. 4. The thickness of this silicon oxide layer 120 can range from about 3000 to 6000 angstroms.

The silicon oxide layer 120 is then planarized using any suitable conventional method such as an etch back process or a chemical mechanical polishing (CMP) process. Next, a thick silicon oxide layer 122 is deposited on the silicon oxide layer 120 to a thickness of about 500–5000 angstroms, for example, using a conventional low pressure chemical vapor deposition (LPCVD) or plasma enhanced chemical vapor deposition (PECVD) process. Further, a silicon nitride layer 124 is subsequently formed on the thick silicon oxide layer 122. In this embodiment, this silicon nitride layer 124 is deposited using a conventional low pressure chemical vapor deposition (LPCVD) or plasma enhanced chemical vapor deposition (PECVD). The thickness of the silicon nitride layer 124 is about 300 to 3000 angstroms.

Figure 5:
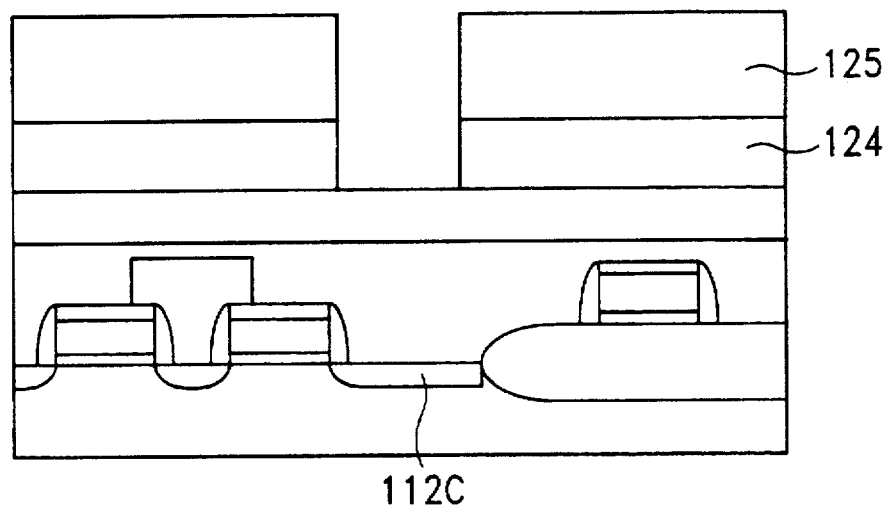

Still referring to FIG. 4, a photoresist layer 125 is then formed and patterned on the silicon nitride layer 124 using conventional photolithographic techniques, defining a contact hole over a portion of the source 112C by etching a portion of the silicon nitride layer 124 as shown in FIG. 5.

Figure 6:
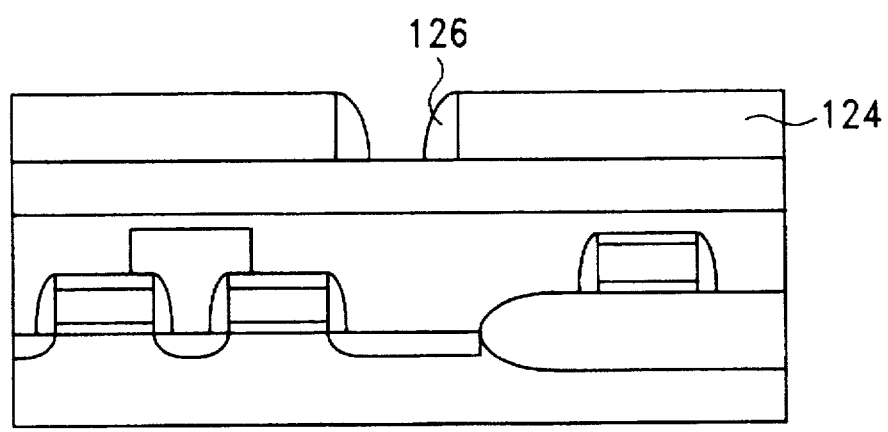

Turning to FIG. 6, after removing the photoresist layer 125, an undoped polysilicon spacer 126 is then formed on the sidewall of the silicon nitride layer 124 in the contact hole mentioned above. This polysilicon spacer 126 is preferably formed by firstly depositing an undoped polysilicon layer 126, for example, using a standard chemical vapor deposition process on the silicon nitride layer 124 and the exposed silicon oxide layer 122, followed by etching back the undoped polysilicon layer 126. It is appreciated that the polysilicon spacer 126 may be a doped polysilicon.

Figure 7:
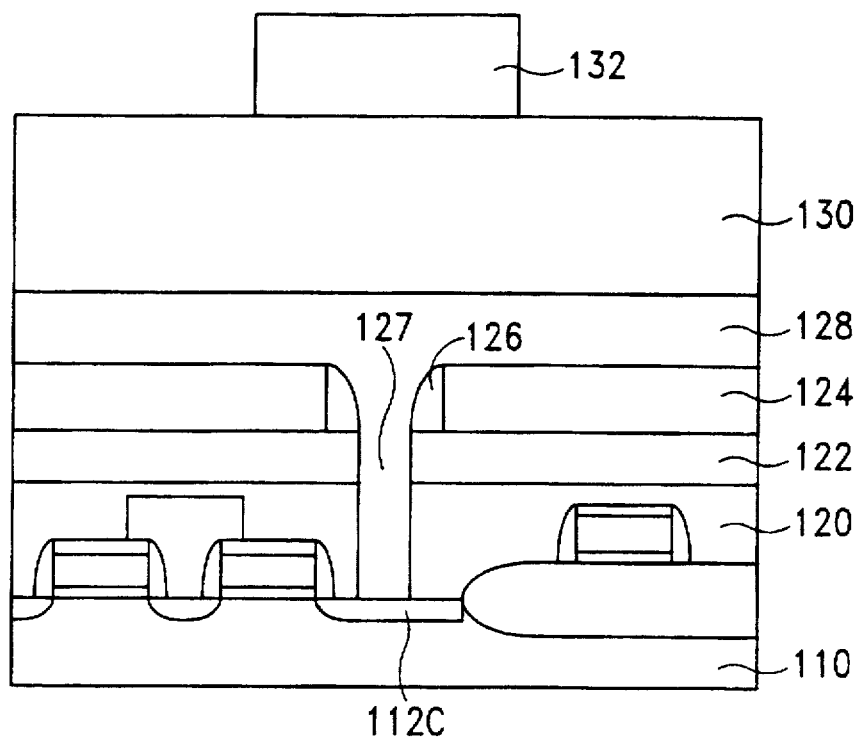

Subsequently, portions of the thick silicon oxide layer 122 and the silicon oxide layer 120 are etched until the surface of the source 112C is exposed using the polysilicon spacer 126 and the silicon nitride layer 124 as a mask, resulting in forming a hole 127 as shown in the structure of FIG. 7. In this embodiment, the thick silicon oxide layer 122 and the silicon oxide layer 120 are etched by using a conventional dry etching process.

Still referring to FIG. 7, an $n^+$ doped polysilicon layer 128 and a silicon nitride layer 130 are sequentially formed over the substrate 110, the polysilicon spacer 126, and the silicon nitride layer 124, thereby refilling the hole 127 with the doped polysilicon 128.

Figure 8:
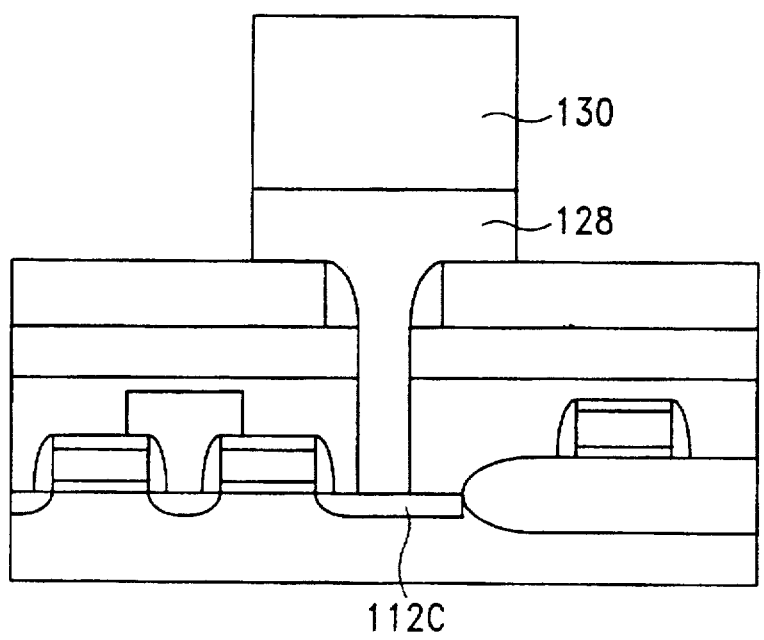

A photoresist layer 132 is then formed and patterned on the silicon nitride layer 130 using conventional photolithographic techniques, defining a storage node over a portion of the source 112C by etching portions of the silicon nitride layer 130 and the doped polysilicon layer 128 as shown in FIG. 8.

Figure 9:
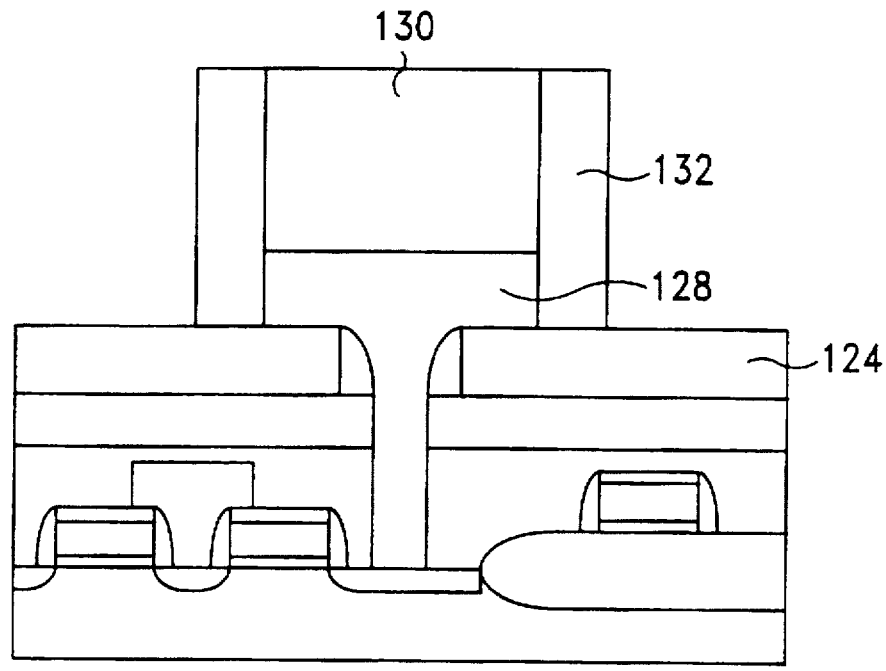

Referring to FIG. 9, another $n^+$ doped polysilicon spacer 132 is then formed on the sidewalls of the silicon nitride layer 130 and the doped polysilicon layer 128. This polysilicon spacer 132 is preferably formed by firstly depositing a doped polysilicon layer 132, for example, using a standard chemical vapor deposition process on the silicon nitride layer 130 and the silicon nitride layer 124, followed by etching back the doped polysilicon layer 132.

Figure 10:
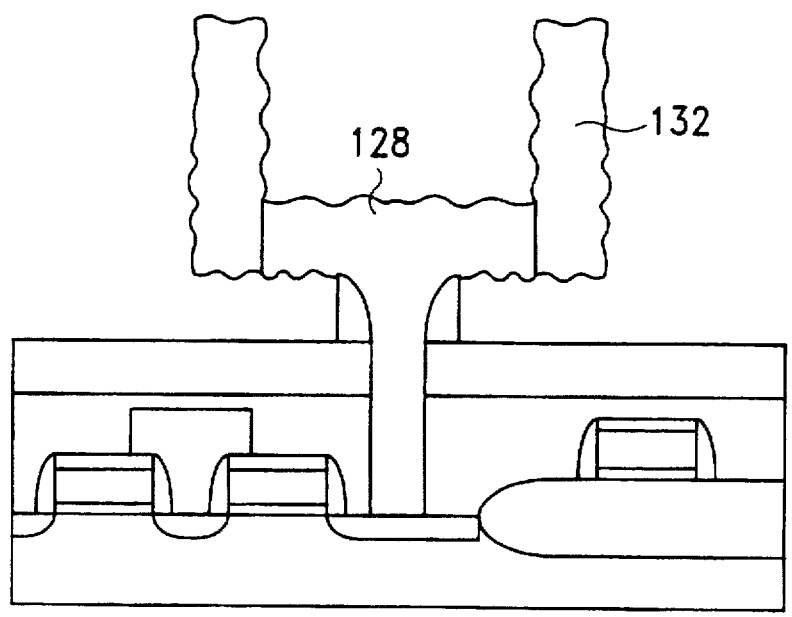

The structure of FIG. 9 is then subjected to etching by phosphoric acid solution ($H_3PO_4$), thereby removing the silicon nitride layer 130 and the silicon nitride layer 124, and roughening the surface of the doped polysilicon layer 132 and the doped polysilicon layer 128 as shown in FIG. 10. The technique of achieving roughened surface of a polysilicon layer has been suggested in U.S. Pat. No. 5,266,514 by Tuan et al. The etching rate of this etching process is dopant dependent and is about 200–2000 angstroms per hour in this embodiment. In this embodiment, the composition of the phosphoric acid solution ($H_3PO_4$) is preferably about 86+/−1% $H_3PO_4$ and 14+/−1% $H_2O$. The temperature used in the embodiment is preferably about 150°–170° C., and can range between about 140° C. to 180° C.

Figure 11:
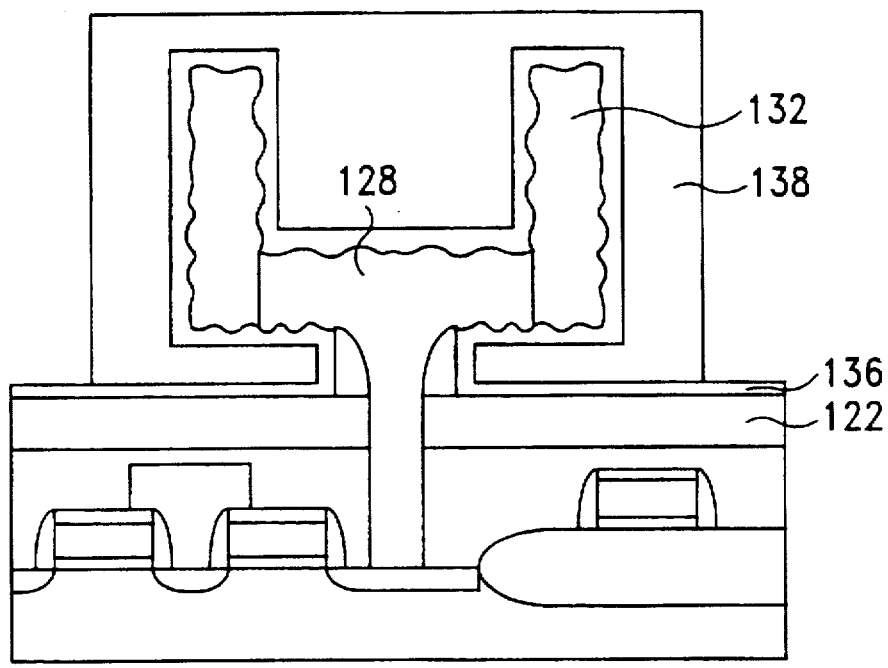

Referring to FIG. 11, a dielectric film 136 and a top electrode 138 of the DRAM cell capacitor can then be formed in the conventional manner. In this embodiment, a thin dielectric layer 136, such as stacked oxide-nitride-oxide (ONO) film, is formed on the exposed surface of the bottom electrode (i.e., the storage node consisting of doped polysilicon layers 132 and 128) and the surface of the thick silicon oxide layer 122. As is known in the art of DRAM fabrication, the ONO film is reliable over silicon surfaces, and is typically used as a capacitor insulator. The ultra-thin bottom oxide layer of the stacked oxide-nitride-oxide (ONO) film 136 is formed by thermally oxidizing the polysilicon surface, then an LPCVD silicon nitride layer is deposited followed by oxidizing the silicon nitride layer to form the top oxide layer. Other material, such as NO, $Ta_2O_5$, $TiO_2$, PZT, or BST can be used as the thin dielectric layer 136. A conductive layer 138 is then deposited over the stack oxide/silicon nitride/oxide layer 136 to serve as an upper plate of the DRAM cell capacitor, thereby forming a dynamic random access memory cell with a ragged polysilicon crown-shaped capacitor. Typically, the conductive layer 138 is a doped polysilicon layer formed in the same manner as the polysilicon layer 126. Other material, such as metal or silicide, can be used as the conductive layer 138.

Although specific embodiments have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, said method comprising:

forming a first dielectric layer on a semiconductor substrate;

forming a first silicon nitride layer on said first dielectric layer;

removing a portion of said first silicon nitride layer to form a first hole therein, therefore exposing a surface of said first dielectric layer;

patterning to form a first polysilicon spacer on sidewall of said first silicon nitride layer;

etching portions of said first dielectric layer using said first polysilicon spacer and said first silicon nitride layer as a mask, therefore exposing a surface of said substrate, and forming a second hole in said first dielectric layer;

forming a second doped polysilicon layer on said first silicon nitride layer, said first polysilicon spacer, and said substrate, thereby refilling said second hole;

forming a second silicon nitride layer on said second doped polysilicon layer;

patterning said second silicon nitride layer and said second doped polysilicon layer to form a storage node;

patterning to form a third doped polysilicon spacer on sidewalls of said patterned second silicon nitride layer and said second doped polysilicon layer;

etching said second silicon nitride layer and said first silicon nitride layer by phosphoric acid solution ($H_3PO_4$), surfaces of said third doped polysilicon spacer and said second doped polysilicon layer being roughened;

forming a second dielectric layer on said third doped polysilicon spacer, said second doped polysilicon layer, and said first dielectric layer; and forming a conductive layer on said second dielectric layer.

2. The method according to claim 1, wherein said first dielectric layer comprises silicon oxide.

3. The method according to claim 1, wherein said second dielectric layer comprises a material selected from the group consisted of stacked oxide-nitride-oxide (ONO) film, NO, $Ta_2O_5$, $TiO_2$, PZT, and BST.

4. The method according to claim 1, wherein said third doped polysilicon spacer and said second doped polysilicon layer are roughened at a temperature of about 140°–180° C.

5. The method according to claim 1, wherein a composition of the phosphoric acid solution ($H_3PO_4$) is about 86+/−1% $H_3PO_4$ and 14+/−1% $H_2O$.

6. The method according to claim 1, wherein an etching rate of etching said second silicon nitride layer and said first silicon nitride layer by the phosphoric acid solution ($H_3PO_4$) is about 200–2000 angstroms per hour.

7. The method according to claim 1, wherein said first polysilicon spacer is formed by the following steps:

forming a first polysilicon layer on said first silicon nitride layer and said first dielectric layer; and etching back said first polysilicon layer to form said first polysilicon spacer.

8. The method according to claim 1, wherein said third doped polysilicon spacer is formed by the following steps:

forming a third doped polysilicon layer on second silicon nitride layer and said first silicon nitride layer; and etching back said third doped polysilicon layer to form said third doped polysilicon spacer.

9. The method according to claim 1, wherein said first polysilicon spacer comprises doped polysilicon.

10. The method according to claim 1, wherein said first polysilicon spacer comprises undoped polysilicon.

11. A method for forming a capacitor of a dynamic random access memory cell, said method comprising:

forming a first dielectric layer on a semiconductor substrate;

forming a silicon oxide layer on said first dielectric layer;

forming a first silicon nitride layer on said silicon oxide layer;

removing a portion of said first silicon nitride layer to form a first hole therein, therefore exposing a surface of said silicon oxide layer, said hole being formed approximately over a portion of a source area in said substrate;

patterning to form a first polysilicon spacer on sidewall of said first silicon nitride layer;

etching portions of said silicon oxide layer and said first dielectric layer using said first polysilicon spacer and said first silicon nitride layer as a mask, therefore exposing a surface of said substrate, and forming a second hole in said silicon oxide layer and said first dielectric layer;

forming a second doped polysilicon layer on said first silicon nitride layer, said first polysilicon spacer, and said substrate, thereby refilling said second hole;

forming a second silicon nitride layer on said second doped polysilicon layer;

patterning said second silicon nitride layer and said second doped polysilicon layer to form a storage node;

patterning to form a third doped polysilicon spacer on sidewalls of said patterned second silicon nitride layer and said second doped polysilicon layer;

etching said second silicon nitride layer and said first silicon nitride layer by phosphoric acid solution ($H_3PO_4$), surfaces of said third doped polysilicon spacer and said second doped polysilicon layer being roughened;

forming a second dielectric layer on said third doped polysilicon spacer, said second doped polysilicon layer, and said silicon oxide layer; and forming a conductive layer on said second dielectric layer.

12. The method according to claim 11, wherein said first dielectric layer comprises doped silicon oxide.

13. The method according to claim 11, wherein said second dielectric layer comprises a material selected from the group consisted of stacked oxide-nitride-oxide (ONO) film, NO, $Ta_2O_5$, $TiO_2$, PZT, and BST.

14. The method according to claim 11, wherein said third doped polysilicon spacer and said second doped polysilicon layer are roughened at a temperature of about 140°–180° C.

15. The method according to claim 11, wherein a composition of the phosphoric acid solution ($H_3PO_4$) is about 86% $H_3PO_4$ and 14% $H_2O$.

16. The method according to claim 11, wherein an etching rate of etching said second silicon nitride layer and said first silicon nitride layer by the phosphoric acid solution ($H_3PO_4$) is about 200–2000 angstroms per hour.

17. The method according to claim 11, wherein said first polysilicon spacer is formed by the following steps:

forming a first polysilicon layer on said first silicon nitride layer and said silicon oxide layer; and etching back said first polysilicon layer to form said first polysilicon spacer.

18. The method according to claim 11, wherein said third doped polysilicon spacer is formed by the following steps:

forming a third doped polysilicon layer on said second silicon nitride layer and said first silicon nitride layer; and etching back said third doped polysilicon layer to form said third doped polysilicon spacer.

19. The method according to claim 11, wherein said first polysilicon spacer comprises doped polysilicon.

20. The method according to claim 11, wherein said first polysilicon spacer comprises undoped polysilicon.

* * * * *